(12) United States Patent
Kang et al.

(10) Patent No.: US 11,869,860 B2
(45) Date of Patent: Jan. 9, 2024

(54) STORAGE DEVICE GENERATING MULTI-LEVEL CHIP ENABLE SIGNAL AND OPERATING METHOD THEREOF

(71) Applicant: SAMSUNG ELECTRONICS CO., LTD., Suwon-si (KR)

(72) Inventors: Hyunsuk Kang, Seoul (KR); Daehoon Na, Seoul (KR); Chiweon Yoon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 269 days.

(21) Appl. No.: 17/479,194

(22) Filed: Sep. 20, 2021

(65) Prior Publication Data

US 2022/0236917 A1  Jul. 28, 2022

(30) Foreign Application Priority Data

Jan. 22, 2021 (KR) .................. 10-2021-0009749

(51) Int. Cl.
| | |
|---|---|
| *G11C 7/10* | (2006.01) |
| *H01L 23/00* | (2006.01) |
| *H01L 25/065* | (2023.01) |
| *H01L 25/18* | (2023.01) |
| *G11C 5/02* | (2006.01) |

(52) U.S. Cl.
CPC .......... *H01L 24/08* (2013.01); *H01L 25/0657* (2013.01); *H01L 25/18* (2013.01); *G11C 5/025* (2013.01); *H01L 2224/08145* (2013.01); *H01L 2225/06506* (2013.01); *H01L 2225/06562* (2013.01)

(58) Field of Classification Search
None
See application file for complete search history.

(56) References Cited

U.S. PATENT DOCUMENTS

| | | | |
|---|---|---|---|
| 6,388,886 B1* | 5/2002 | Tobita | ........ H05K 1/14 174/541 |
| 6,649,428 B2 | 11/2003 | Kai | |
| 7,236,423 B2 | 6/2007 | Sohn et al. | |
| 7,916,511 B2 | 3/2011 | Park | |
| 8,076,764 B2 | 12/2011 | Yamada et al. | |
| 8,462,536 B2 | 6/2013 | Nobunaga et al. | |

(Continued)

FOREIGN PATENT DOCUMENTS

| | | |
|---|---|---|
| KR | 10-0697270 | 3/2007 |
| KR | 10-2020-0030794 | 3/2020 |

*Primary Examiner* — Tan T. Nguyen
(74) *Attorney, Agent, or Firm* — F. Chau & Associates, LLC

(57) ABSTRACT

A storage device includes a controller including first and second pins and configured to output a multi-level chip enable signal through the second pin, and a memory device. The memory device includes third and fourth pins respectively connected to the first and second pins, and a plurality of memory chips commonly connected to the fourth pin. The plurality of memory chips respectively include a plurality of resistors connected to one another in a daisy-chain structure between the third pin and a first voltage terminal. The plurality of memory chips are configured to respectively generate a plurality of reference voltage periods that divide between a voltage level of the third pin and a voltage level of the first voltage terminal based on the plurality of resistors.

20 Claims, 15 Drawing Sheets

(56) References Cited

U.S. PATENT DOCUMENTS

| | | | |
|---|---|---|---|
| 9,286,950 B2 | 3/2016 | Kim | |
| 10,014,038 B2 | 7/2018 | Morohashi | |
| 10,277,228 B1* | 4/2019 | Buch | G01R 31/275 |
| 10,685,691 B2 | 6/2020 | Jung | |
| 2015/0340069 A1* | 11/2015 | Arai | G11C 29/021 |
| | | | 326/30 |
| 2016/0276265 A1* | 9/2016 | Iwabuchi | H01L 28/60 |
| 2022/0011375 A1* | 1/2022 | Takahashi | H01M 10/48 |
| 2022/0164517 A1* | 5/2022 | Tang | G03F 1/36 |

* cited by examiner

| CE_Out1 | CE_Out2 | nCEi_1 | CHIP Enable |
|---|---|---|---|
| H | H | H | DISABLE |
| L | H | L | ENABLE |
| H | L | – | – |
| L | L | H | DISABLE |

# STORAGE DEVICE GENERATING MULTI-LEVEL CHIP ENABLE SIGNAL AND OPERATING METHOD THEREOF

CROSS-REFERENCE TO RELATED APPLICATION

This U.S. patent application claims priority under 35 U.S.C. § 119 to Korean Patent Application No. 10-2021-0009749, filed on Jan. 22, 2021, in the Korean Intellectual Property Office, the disclosure of which is incorporated by reference in its entirety herein.

BACKGROUND

1. Technical Field

The inventive concept relates to a storage device, and more particularly, to a storage device generating a multi-level chip enable signal and an operating method of the storage device.

2. Discussion of Related Art

Non-volatile memory is a type of memory that can retain stored information even after power is removed. Examples of non-volatile memory include flash memory, read-only memory (ROM), ferroelectric random-access memory (F-RAM), and magnetoresistive random-access memory (MRAM).

A storage device may include a nonvolatile memory and a controller for controlling the nonvolatile memory. The nonvolatile memory may include a plurality of memory chips stacked on top of one another to implement a multi-stack memory. The storage device may support a chip enable reduction (CER) mode to select a chip in the multi-stack memory. In the CER mode, each of the plurality of memory chips may be identified by a chip address so that one chip enable signal may be shared.

SUMMARY

At least one embodiment of the inventive concept provides a storage device generating a multi-level chip enable signal and an operating method of the storage device.

According to an embodiment of the inventive concept, there is provided a storage device including a controller and a memory device. The controller includes first and second pins, and the controller is configured to output a multi-level chip enable signal through the second pin. The memory device includes a third pin connected to the first pin and a fourth pin connected to the second pin. The memory device includes a plurality of memory chips commonly connected to the fourth pin. The plurality of memory chips respectively include a plurality of resistors connected in a daisy-chain structure between the third pin and a first voltage terminal. The plurality of memory chips are configured to respectively generate a plurality of reference voltage periods that divide between a voltage level of the third pin and a voltage level of the first voltage terminal based on plurality of resistors. When a voltage level of the multi-level chip enable signal corresponds to one of the plurality of reference voltage periods, a memory chip corresponding to the one reference voltage period is selected from among the plurality of memory chips.

According to an embodiment of the inventive concept, there is provided a storage device including a plurality of memory chips respectively including a plurality of resistors; and a controller. The controller is connected to the plurality of memory chips through a first pin and include a first resistor connected to the first pin. The plurality of resistors included in the plurality of memory chips are connected in a daisy-chain structure between a third pin connected to the first pin and a first voltage terminal. The controller is configured to detect package information indicating a number of the plurality of memory chips based on a voltage level of the first pin.

According to an embodiment of the inventive concept, there is provided an operating method of a storage device. The method includes a plurality of memory chips respectively generating a plurality of reference voltage periods that divide between a first voltage level and a voltage level of a first voltage terminal connected to a plurality of resistors based on the plurality of resistors connected in a daisy-chain structure; and a controller outputting a multi-level chip enable signal to the plurality of memory chips, wherein when a voltage level of the multi-level chip enable signal corresponds to one of the plurality of reference voltage periods, a memory chip corresponding to the one reference voltage period is selected from among the plurality of memory chips.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the accompanying drawings.

Figure 1:
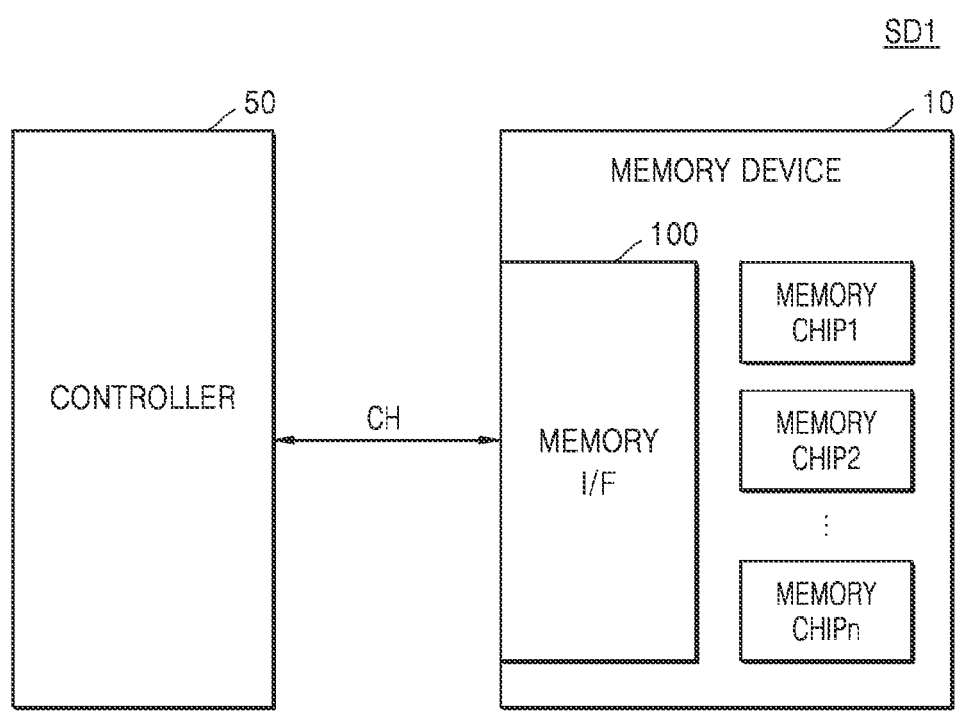
FIG. 1 schematically shows a storage device according to an embodiment of the inventive concept.

FIG. 1 schematically shows a storage device SD1 according to an embodiment of the inventive concept.

Referring to FIG. 1, the storage device SD1 includes a memory device 10 and a controller 50 (e.g., a control circuit), and the memory device 10 may be a nonvolatile memory device including a plurality of memory chips. The plurality of memory chips may be connected to the controller 50 through the same channel CH, and accordingly, the plurality of memory chips may exchange commands, addresses, and data with the controller 50 through the same channel CH.

The memory device 10 may receive commands and addresses from the controller 50 through a memory interface circuit 100, may transmit data to the controller 50 through the memory interface circuit 100 and receive data from the controller 50 through the memory interface circuit 100. The memory interface circuit 100 may receive data to be written to the memory device 10 from the controller 50 or transmit data read from the memory device 10 to the controller 50. The memory interface circuit 100 may be implemented to comply with a standard specification such as Toggle or Open NAND Flash Interface Working Group (ONFI).

In an embodiment, the memory device 10 includes a plurality of memory chips stacked on top of one another to form a multi-stack memory. For example, the memory device 10 may be configured as a multi-chip package such as a dual die package (DDP), a quadruple die package (QDP), an octuple die package (ODP), or a high density package (HDP). When the memory device 10 is implemented as the multi-stack memory, the storage device SD1 may support a chip enable reduction (CER) mode, and a chip address may be allocated for each memory chip. The memory interface circuit 100 may receive a chip enable signal and an address from the controller 50. When the chip enable signal is in an enable state (e.g., a low level), a chip having the same chip address as the received address may be selected, and the selected memory chip may operate according to an individual command from the controller 50.

In an embodiment, each of the plurality of memory chips is a nonvolatile memory chip. For example, each of the plurality of memory chips may be a NAND flash memory chip. For example, at least one of the plurality of memory chips may be a vertical NAND (VNAND) flash memory chip, and the vertical NAND flash memory chip may include word lines stacked on a substrate in a vertical direction and cell strings each including a plurality of memory cells connected to each of the word lines.

However, the inventive concept is not limited thereto, and the memory device 10 may include various types of memory chips. As an example, at least one of the plurality of memory chips may be a dynamic random access memory (DRAM) chip such as a Double Data Rate Synchronous Dynamic Random Access Memory (DDR SDRAM) chip, a Low Power Double Data Rate (LPDDR) SDRAM chip, a Graphics Double Data Rate (GDDR) SDRAM chip, a Rambus Dynamic Random Access Memory (RDRAM) chip, etc. In addition, as an example, at least one of the plurality of memory chips may be a resistive memory chip such as resistive RAM (ReRAM), phase change RAM (PRAM), and magnetic RAM (MRAM).

In some embodiments, the storage device SD1 may be an internal memory embedded in an electronic device. For example, the storage device SD1 may be an SSD, an embedded Universal Flash Storage (UFS) memory device, or an embedded Multi-Media Card (eMMC). In some embodiments, the storage device SD1 may be an external memory detachable from the electronic device. For example, the storage device SD1 may be a UFS memory card, Compact Flash (CF), Secure Digital (SD), Micro Secure Digital (Micro-SD), Mini Secure Digital (Mini-SD), extreme digital (xD), or a memory stick.

Figure 2:
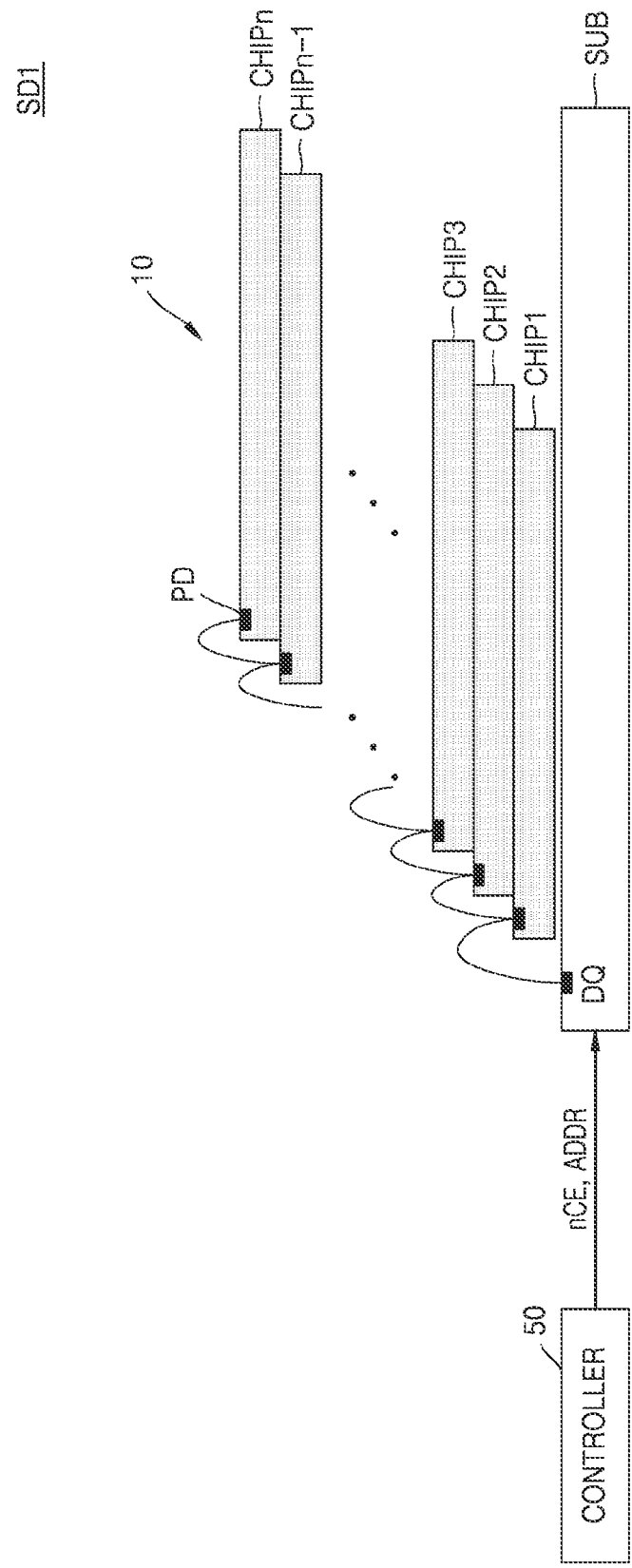
FIG. 2 is a diagram illustrating a storage device according to an embodiment of the inventive concept.

FIG. 2 is a diagram illustrating the storage device SD1 according to an embodiment of the inventive concept.

Referring to FIG. 2, the storage device SD1 includes the memory device 10 and the controller 50. The memory device 10 includes a substrate SUB and a plurality of memory chips CHIN to CHIPn stacked on the substrate SUB. For example, a data input/output pin DQ may be disposed on the substrate SUB and connected to an input/output pad PD of each of the plurality of memory chips CHIP1 to CHIPn by wires using wire bonding. The controller 50 may transmit commands, addresses, and data to the plurality of memory chips CHIP1 to CHIPn through the data input/output pin DQ.

In some embodiments, the memory device 10 may include a plurality of bonding pads to distinguish the plurality of memory chips CHIP1 to CHIPn. For example, when the memory device 10 include sixteen memory chips, each memory chip may include four bonding pads for allocation of a chip address. Each of the four bonding pads may output 1 (e.g., a voltage representing a logical 1) when hard-bonded with a power voltage terminal when a power voltage is applied, and output 0 (e.g., a voltage representing a logical 0) when not hard-bonded with the power voltage terminal, and thus $2^4$ chip addresses may be allocated.

In an embodiment, the memory chips CHIP1 to CHIPn receive a chip enable signal nCE and a chip address ADDR from the controller 50 through the data input/output pin DQ. When the chip enable signal nCE is in an enable state (e.g., a low level), a chip having bonding corresponding to the received chip address ADDR is selected. As a result, the plurality of memory chips CHIP1 to CHIPn may have a limit in chip size reduction (CSR) due to bonding pads for allocation of the chip address ADDR, and a solution for improving integration of the chip may be required.

Figure 3:
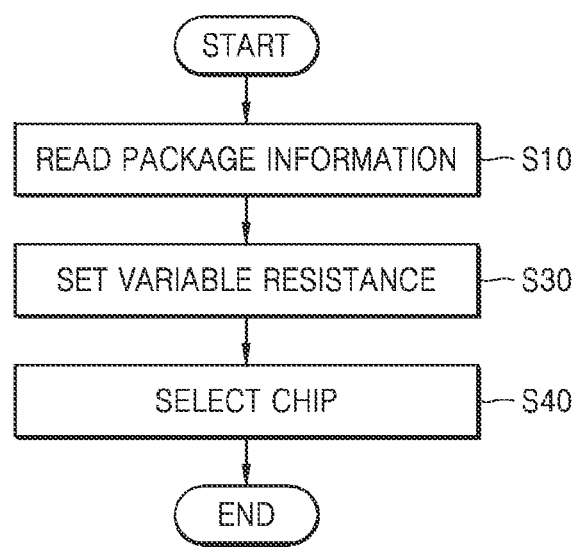
FIG. 3 is a flowchart schematically illustrating an operation of a storage device according to an embodiment of the inventive concept.

FIG. 3 is a flowchart schematically illustrating an operation of a storage device according to an embodiment of the inventive concept.

Figure 4:
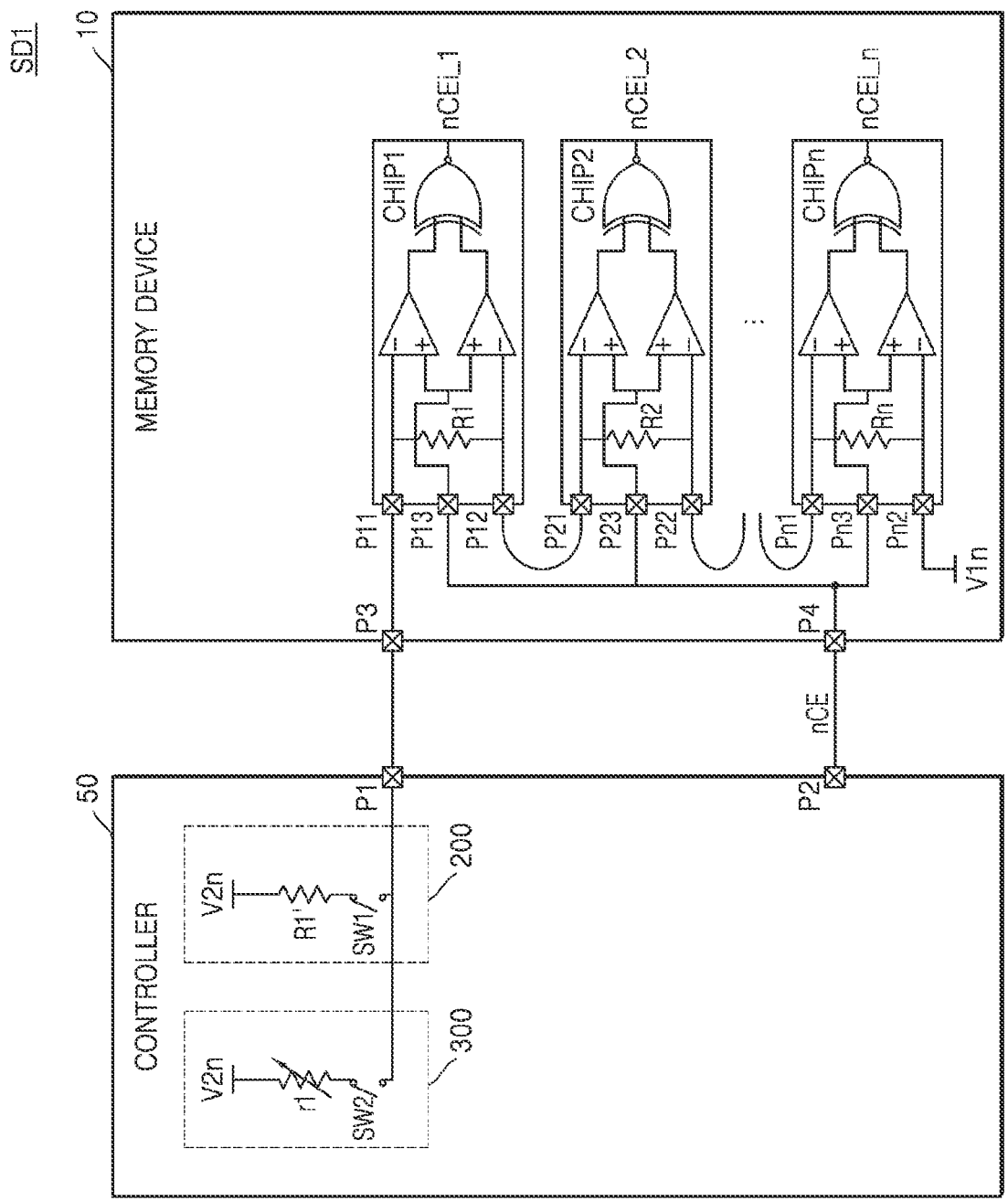
FIG. 4 is a circuit diagram illustrating a storage device according to an embodiment of the inventive concept.

Referring to FIGS. 3 and 4, in operation S10, the controller 50 reads package information. In an embodiment, the package information indicates the number of memory chips included in the memory device 10. In an embodiment, the memory device 10 includes resistors R1 to Rn connected in a daisy-chain structure, and the controller 50 includes first resistor R1' connected to the resistors R1 to Rn connected in the daisy-chain structure. The controller 50 may determine the number of memory chips by detecting a voltage distributed between the resistors R1 to Rn connected in the daisy-chain structure and the first resistor R1' in response to a power voltage. The detected voltage may correspond to the package information.

In operation S30, the controller 50 sets a variable resistance value r1. In an embodiment, the resistors R1 to Rn connected in the daisy-chain structure are connected to a third pin P3 and a first voltage terminal V1n. The controller 50 may set a variable resistance value r1 according to the number of memory chips, so that a voltage level of the third pin P3 has a value independent of the number of memory chips. For example, a resistance of a variable resistor of the controller 50 may be set based on the number of the memory chip determined from the voltage.

In operation S40, the controller 50 selects a memory chip. The plurality of memory chips CHIP1 to CHIPn may respectively generate a plurality of reference voltage periods dividing a voltage level of the third pin P3 and a voltage level of the first voltage terminal V1n based on the voltage distribution of the resistors R1 to Rn connected in the daisy-chain structure. For example, the memory chips CHIP1 to CHIPn may respectively generate a plurality of different reference voltage pulses by the dividing a voltage range between a voltage level of the third pin P3 and a voltage level of the first voltage terminal V1n. The controller 50 may output the multi-level chip enable signal nCE to the plurality of memory chips CHIP1 to CHIPn to select one of the memory chips. For example, the first memory chip CHIP1 may be selected when a voltage level of the multi-level chip enable signal nCE corresponds to a first reference voltage period among the plurality of reference voltage periods. For example, the first memory chip CHIP1 may be selected when a voltage level of the multi-level chip enable signal nCE corresponds to a first reference voltage pulse among the plurality of reference voltage pulses.

According to an embodiment, a plurality of memory chips are classified according to a plurality of reference voltage periods (or pulses) generated based on resistors connected in a daisy-chain structure, and thus a bonding pad for allocation of a chip address may be omitted in a multi-stack memory. Accordingly, the size of the memory chip may be reduced and integration thereof may be improved. In addition, as will be described later with reference to FIG. 17, according to an embodiment, when the voltage level of the multi-level chip enable signal nCE corresponds to the first reference voltage period that is one of the plurality of reference voltage periods, a memory chip corresponding to the first reference voltage period (or pulse) is selected, and thus a time required for transmitting a command and a chip address for chip selection may be reduced, and efficiency of an input/output interface may be improved.

FIG. 4 is a circuit diagram illustrating the storage device SD1 according to an embodiment of the inventive concept.

Referring to FIG. 4, the storage device SD1 includes the memory device 10 and the controller 50. The memory device 10 includes the plurality of memory chips CHIP1 to CHIPn. The storage device SD1 includes a plurality of pins for transmitting signals input/output between the memory device 10 and the controller 50. Here, the pin may mean a conductor, and may also be referred to as a terminal.

In an embodiment, the controller 50 includes a first pin P1, a first driver 200 (e.g., a driver circuit), and a second driver 300 (e.g., driver circuit). The first pin P1 may be connected to the first driver 200 to read package information of the memory device 10. The first driver 200 may include a first resistor R1' and a first switch SW1. The controller 50 may determine the number of memory chips by turning on the first switch SW1 in a package information read mode and detecting a voltage level of the first pin P1.

In an embodiment, the first pin P1 may be connected to the second driver 300. The second driver 300 may include the variable resistor r1 and a second switch SW2. In an embodiment, the controller 50 sets the variable resistance value r1 according to the determined number of memory chips, and controls the plurality of memory chips CHIP1 to CHIPn to respectively generate a plurality of reference voltage periods (or pulses) by turning on the second switch SW2 in a normal mode. In an embodiment, the variable resistor r1 is implemented by an adjustable resistor or a potentiometer.

In an embodiment, the controller 50 further includes a second pin P2. The second pin P2 may be connected to a fourth pin P4 and commonly connected to the plurality of memory chips CHIP1 to CHIPn. The controller 50 may output the multi-level chip enable signal nCE to the plurality of memory chips CHIP1 to CHIPn through the second pin P2.

In an embodiment, the memory device 10 includes a third pin P3 and the fourth pin P4. The third pin P3 may be connected to the first pin P1, and the fourth pin P4 may be connected to the second pin P2. The plurality of memory chips CHIP1 to CHIPn may include the resistors R1 to Rn connected in a daisy-chain structure. In the present specification, the daisy-chain structure may refer to a continuously connected structure through an input/output pad, an input/output pin, an input/output terminal, etc. For example, the daisy-chain structure may include an output pad of a first memory chip connected to an input pad of a second memory chip. The resistors R1 to Rn connected in the daisy-chain structure may be connected between the third pin P3 and the first voltage terminal V1n, and the plurality of memory chips CHIP1 to CHIPn may respectively generate the plurality of reference voltage periods (or pulses) that divide between a voltage level of the third pin P3 and a voltage level of the first voltage terminal V1n based on the resistors R1 to Rn.

In an embodiment, when the resistors R1 to Rn connected in the daisy-chain structure have the same resistance value, the plurality of memory chips CHIP1 to CHIPn respectively generate the plurality of reference voltage periods (or pulses) that divide between the voltage level of the third pin P3 and the voltage level of the first voltage terminal V1n. However, the inventive concept is not limited thereto, and the resistors R1 to Rn connected in the daisy-chain structure may include at least two resistors having different resistance values, and based on this, the plurality of memory chips CHIP1 to Rn CHIPn may generate the plurality of reference voltage periods including at least two reference voltage periods having sizes of different periods. Hereinafter, the structure of the plurality of memory chips CHIP1 to CHIPn will be described in detail with reference to FIG. 5.

Figure 5:
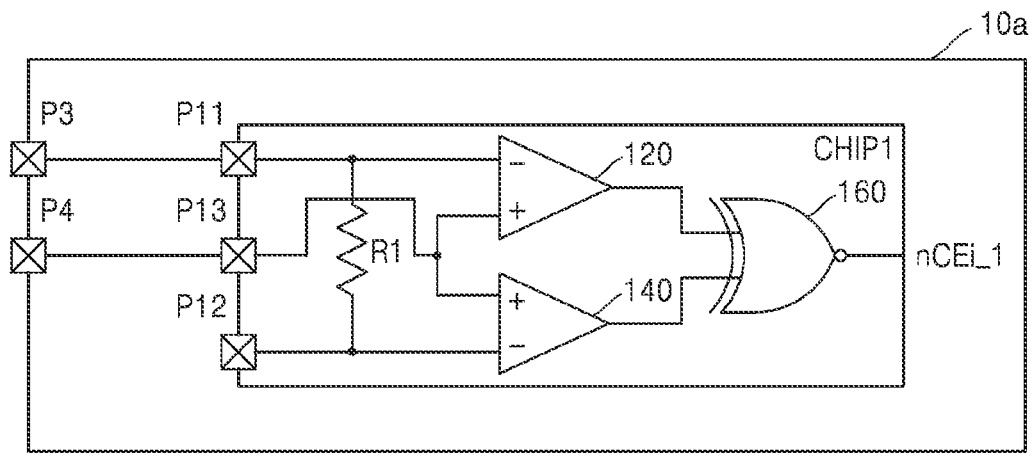
FIG. 5 is a circuit diagram illustrating a first memory chip of FIG. 4 according to an embodiment of the inventive concept.

FIG. 5 is a circuit diagram illustrating the first memory chip CHIP1 of FIG. 4 according to an embodiment of the inventive concept.

Referring to FIGS. 4 and 5, the configuration of the first memory chip CHIP1 may be the same as that of the second to nth memory chips CHIP2 to CHIPn. The first memory chip CHIP1 includes a first input/output pad P11, a second input/output pad P12, and a third input/output pad P13. The first input/output pad P11 is connected to the third pin P3, and the third input/output pad P13 is connected to the fourth pin P4. The first memory chip CHIP1 includes the resistor R1, and the resistor R1 is connected between the first input/output pad P11 and the second input/output pad P12.

In an embodiment, the first memory chip CHIP1 generates a first reference voltage period between a voltage level of the first input/output pad P11 and a voltage level of the second input/output pad P12 based on a voltage drop in the resistor R1. The second input/output pad P12 of the first memory chip CHIP1 is connected to a first input/output pad P21 of the second memory chip CHIP2. Accordingly, the second memory chip CHIP2 may generate a second reference voltage period consecutive to the first reference voltage period. The second memory chip CHIP2 includes input/output pads P21, P22, and P23. The nth memory chip CHIPn includes input/output pads Pn1, Pn2, and Pn3.

In an embodiment, the first memory chip CHIP1 includes a first buffer 120, a second buffer 140, and an exclusive NOR gate 160. As will be described with reference to FIGS. 13 and 14, the first buffer 120, the second buffer 140, and the exclusive NOR gate 160 may be configured to select the first memory chip CHIP1 when the multi-level chip enable signal nCE has a voltage level between voltage levels of the first input/output pad P11 and the second input/output pad P12.

Figure 6:
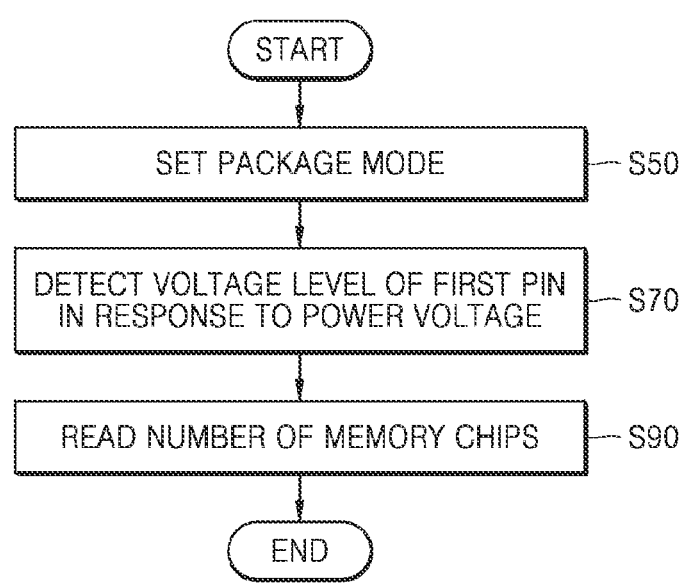
FIG. 6 is a flowchart illustrating an operation of a controller according to an embodiment of the inventive concept.
Figure 7:
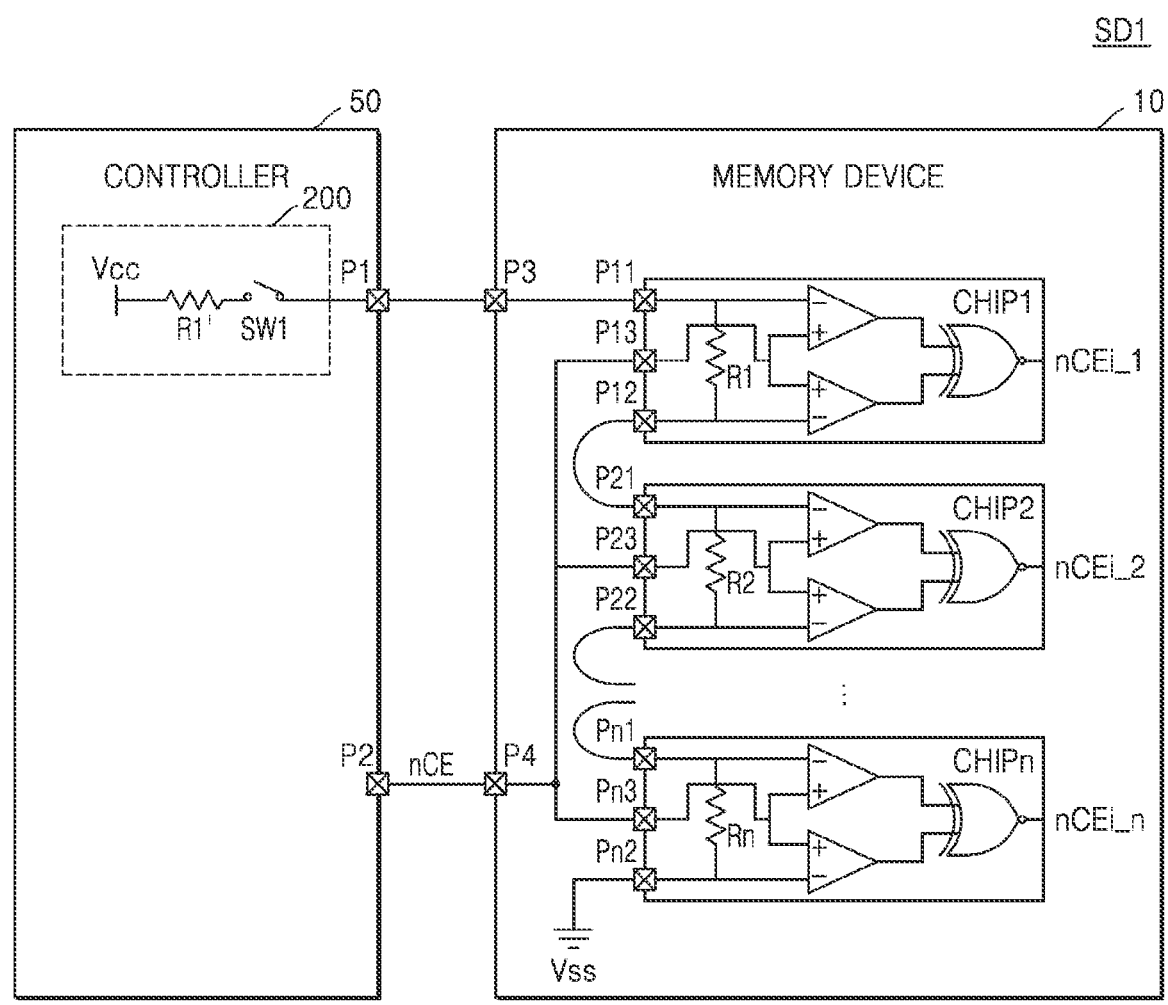
FIG. 7 is a circuit diagram illustrating a storage device according to an embodiment of the inventive concept.

FIG. 6 is a flowchart illustrating an operation of the controller 50 according to an embodiment of the inventive concept. FIG. 7 is a circuit diagram illustrating a storage device according to an embodiment of the inventive concept.

Referring to FIGS. 6 and 7, in operation S50, the controller 50 sets a package read mode. In the package read mode, the controller 50 turns on the first switch SW1 of a first driver 200, and the resistors R1 to Rn connected in a daisy-chain are connected to the first driver 200.

In operation S70, the controller 50 detects a voltage level of the first pin P1 in response to a power voltage. In some embodiments, when the power voltage is supplied to the first driver 200, the power voltage may be distributed between a first resistor R1' and the resistors R1 to Rn connected in the daisy-chain and detected in the voltage level of the first pin P1. For example, a resistance value of each of the resistors R1 to Rn connected in the daisy-chain may be the same as R, and a value of the first resistance R1' of the first driver 200 may be fixed to 4R.

In an embodiment, when the memory device 10 includes the two memory chips CHIP1 to CHIP2, the resistance value of each of the resistors R1 and R2 connected in the daisy-chain may be 2R. For example, when a power voltage of 1.2V is supplied to the first driver 200, the power voltage may be distributed between 4R and 2R so that 0.4V is detected from the first pin P1.

In an embodiment, when the memory device 10 includes four memory chips, the resistance value of each of the four resistors connected in the daisy-chain may be 4R. For example, when a power voltage of 1.2V is supplied to the first driver 200, the power voltage may be distributed between 4R and 4R so that 0.6V is detected from the first pin P1.

In an embodiment, when the memory device 10 includes eight memory chips, the resistance value of each of the eight resistors connected in the daisy-chain may be 8R. For example, when a power voltage of 1.2V is supplied to the first driver 200, the power voltage may be distributed between 4R and 8R so that 0.8V may be detected from the first pin P1.

In operation S90, the controller 50 determines the number of memory chips based on the voltage level detected from the first pin P1. In some embodiments, the controller 50 may include a plurality of preset reference values, and the plurality of preset reference values may have different values according to the number of memory chips. The controller 50 may determine the number of memory chips by comparing the plurality of preset reference values with the voltage level detected from the first pin P1.

Figure 8:
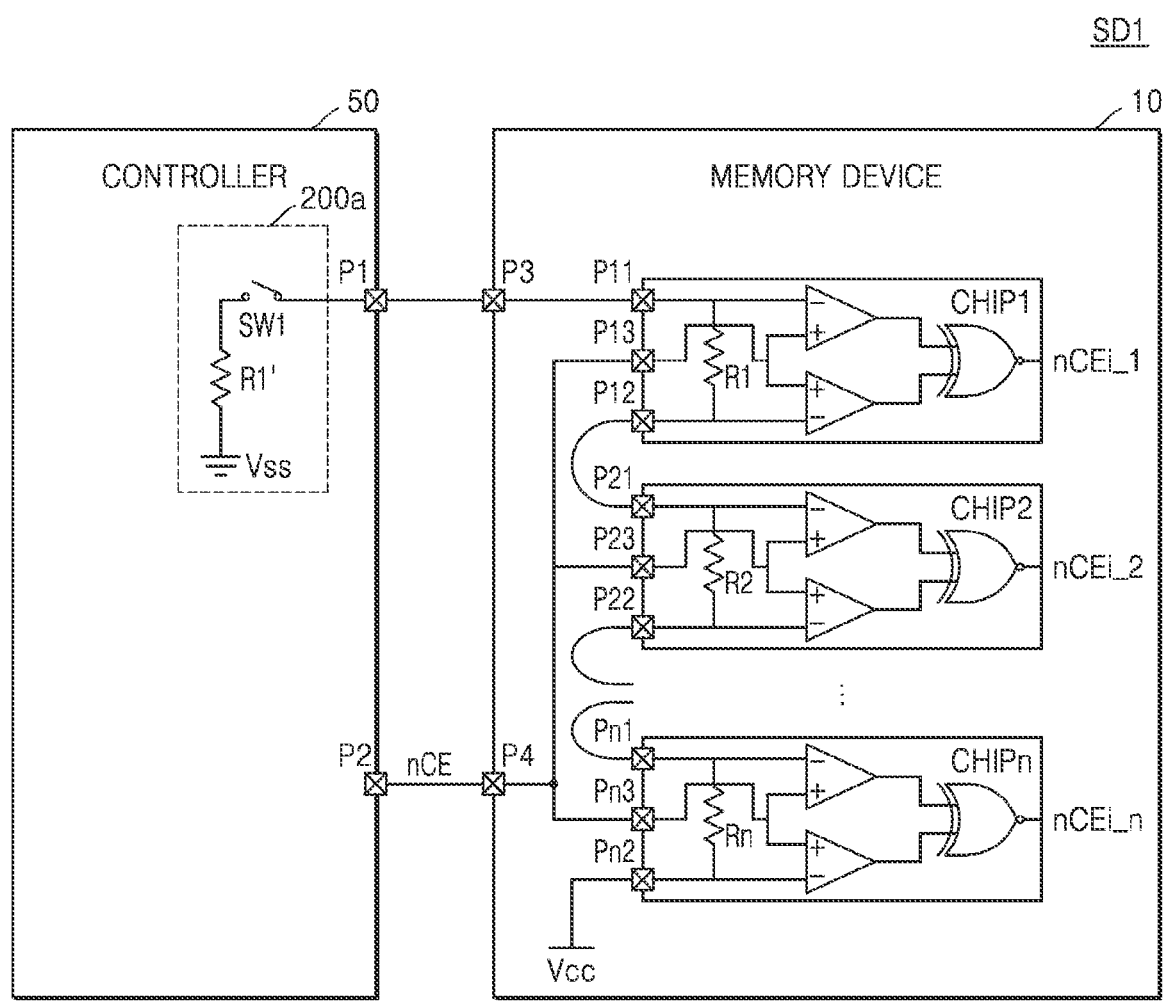
FIG. 8 is a circuit diagram illustrating a storage device according to an embodiment of the inventive concept.

FIG. 8 is a circuit diagram illustrating the storage device SD1 according to an embodiment of the inventive concept.

Referring to FIG. 8, in the storage device SD1, the first resistor R1' may be connected to a ground voltage terminal Vss and a first voltage terminal may be connected to a power voltage terminal Vcc. In an embodiment, the first voltage terminal is connected to a last pin of the nth memory chip CHIPn. The storage device SD1 of FIG. 8 includes a first driver 200a similar to the first driver 200.

When the first voltage terminal is connected to the power voltage terminal Vcc, the power voltage may be distributed between the first resistor R1' and the resistors R1 to Rn connected in the daisy-chain and detected in the voltage level of the first pin P1. As an example as described above, when the power voltage of 1.2V is supplied and the memory device 10 includes the two memory chips CHIP1 to CHIP2, 0.8V may be detected from the first pin P1. When the memory device 10 includes the four memory chips, 0.6V may be detected from the first pin P1. When the memory device 10 may include the eight memory chips, 0.4V may be detected from the first pin P1.

Figure 9:
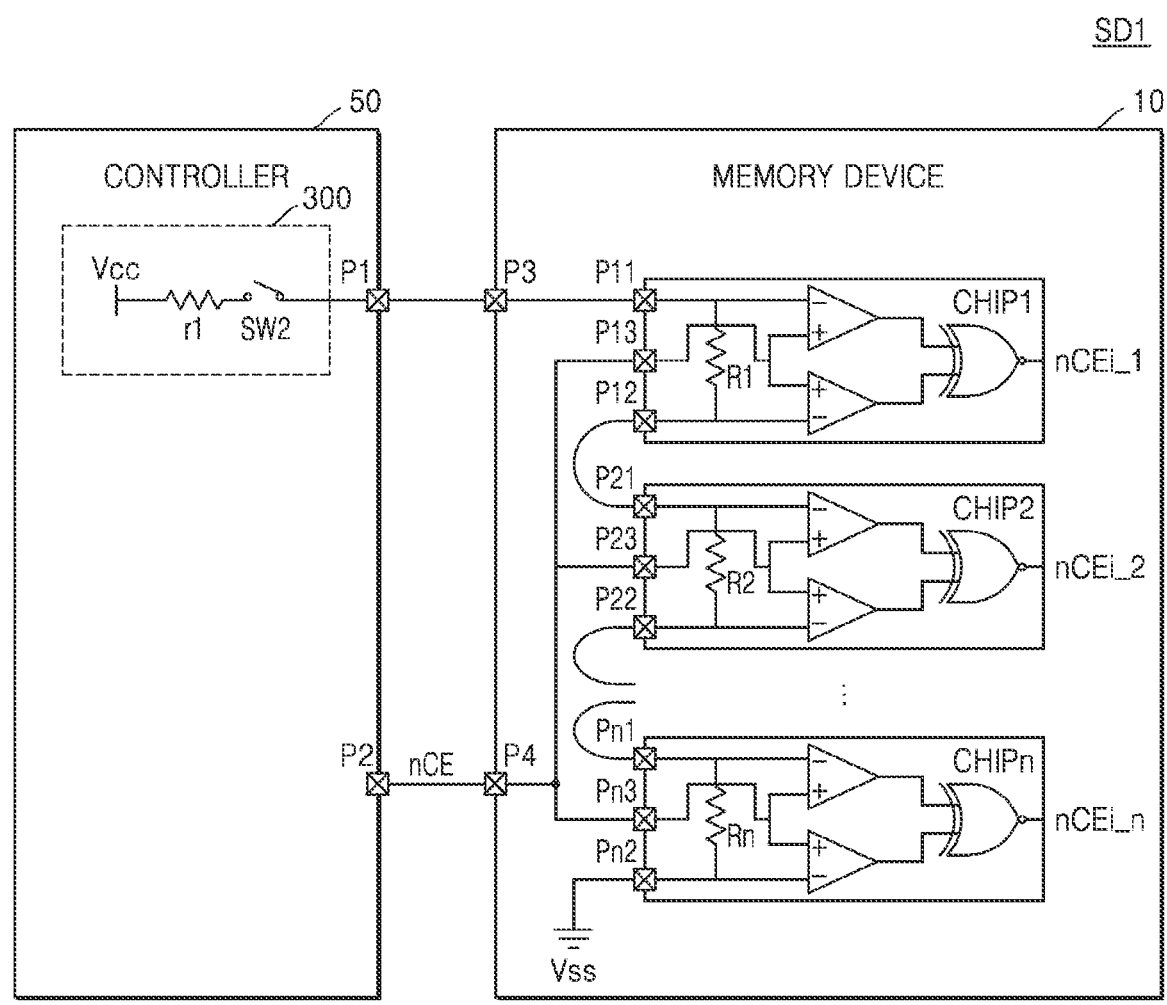
FIG. 9 is a circuit diagram illustrating a storage device according to an embodiment of the inventive concept.

FIG. 9 is a circuit diagram illustrating a storage device according to an embodiment of the inventive concept.

Referring to FIG. 9, the controller 50 determines the number of memory chips based on a voltage level of the first pin P1 and sets the variable resistance value r1 according to the number of memory chips. For example, a resistance value of each of the resistors R1 to Rn connected in a daisy-chain Rn may be the same as R.

In an embodiment, the controller 50 determines that the memory device 10 includes one memory chip CHIP1, and the controller 50 sets the variable resistance value r1 to r. When the power voltage Vcc is supplied to the second driver 300, the power voltage Vcc may be distributed to r and R and detected from the third pin P3.

In an embodiment, the controller 50 determines that the memory device 10 includes the two memory chips CHIP1 to CHIP2, and the controller 50 sets the variable resistance value r1 to 2r. When the power voltage Vcc is supplied to the second driver 300, the power voltage Vcc may be distributed to 2r and 2R and detected from the third pin P3.

In an embodiment, the controller 50 determines that the memory device 10 includes eight memory chips, and the controller 50 sets the variable resistance value r1 to 8r. When the power voltage Vcc is supplied to the second driver 300, the power voltage Vcc may be distributed to 8r and 8R and detected from the third pin P3.

The controller 50 may set the variable resistance value r1 differently according to the number of memory chips, and thus the voltage level of the third pin P3 may have a value independent of the number of memory chips. As an example as described above, the voltage level of the third pin P3 may have a constant value in which the power voltage Vcc is distributed at a ratio of r and R regardless of the number of memory chips.

Figure 10:
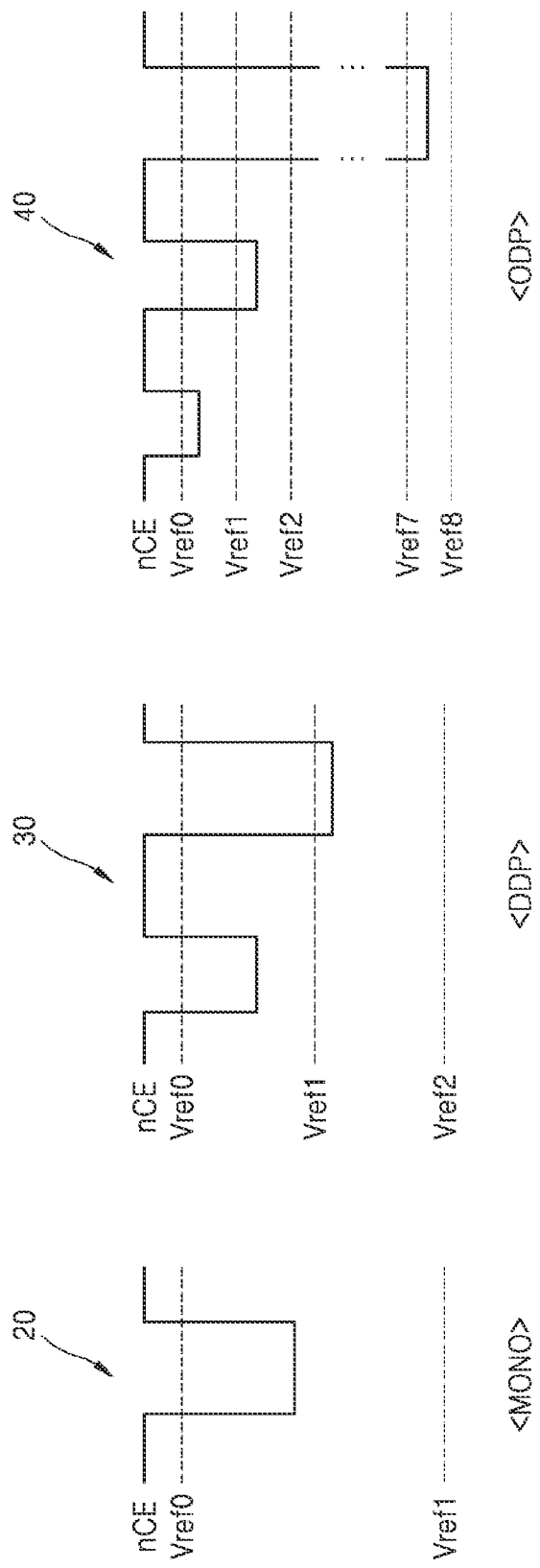
FIG. 10 is a diagram illustrating a reference voltage period of a plurality of memory chips of FIG. 9 according to an embodiment of the inventive concept.

FIG. 10 is a diagram illustrating a reference voltage period of the plurality of memory chips CHIP1 to CHIPn of FIG. 9 according to an embodiment of the inventive concept.

Referring to FIGS. 9 and 10, a first graph 20 shows a reference voltage period when the memory device 10 includes one memory chip. The first memory chip CHIP1 may generate a first reference voltage period Vref0 to Vref1 that divides between a voltage level Vref0 of the third pin P3 and a ground voltage level Vref1.

A second graph 30 shows reference voltage periods when the memory device 10 includes two memory chips. The two memory chips CHIP1 to CHIP2 may respectively generate reference voltage periods that divide between the voltage level Vref0 of the third pin P3 and a ground voltage level Vref2. For example, the first memory chip CHIP1 may generate the first reference voltage period Vref0 to Vref1, and the second memory chip CHIP2 may generate the second reference voltage period Vref1 to Vref2. For example, the multi-level chip enable signal nCE being between Vref0 and Vref1 may indicate the first memory chip CHIP1 is to be selected, and the multi-level chip enable signal nCE being between Vref1 and Vref2 may indicate the second memory chip CHIP2 is to be selected.

A third graph 40 shows reference voltage periods when the memory device 10 includes eight memory chips. The eight memory chips may respectively generate reference voltage periods that divide between the voltage level Vref0 of the third pin P3 and the ground voltage level Vref8. For example, the first memory chip CHIP1 may generate the first reference voltage period Vref0 to Vref1, the second memory chip CHIP2 may generate the second reference voltage period Vref1 to Vref2, and the eighth memory chip may generate an eighth reference voltage period Vref7 to Vref8. For example, the multi-level chip enable signal nCE being between Vref7 and Vref8 may indicate the eight memory chip is to be selected.

When a voltage level of the multi-level chip enable signal nCE received from the controller 50 corresponds to a first reference voltage period that is one of a plurality of reference voltage periods, a memory chip corresponding to the first reference voltage period may be selected. For example, when the voltage level of the multi-level chip enable signal nCE corresponds to the second reference voltage period Vref1 to Vref2 in the third graph 40, the second memory chip CHIP2 may be selected.

Figure 11:
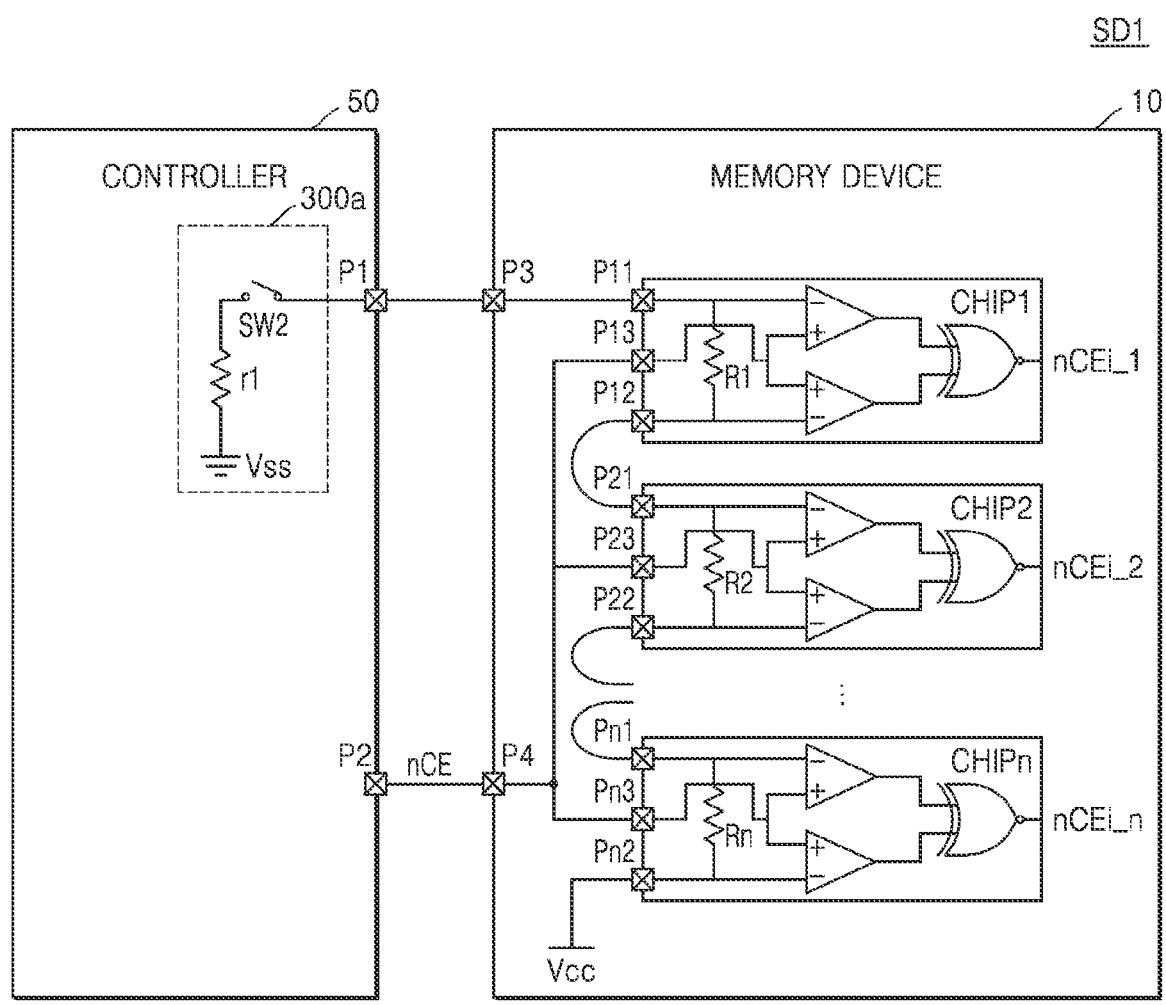
FIG. 11 is a circuit diagram of a storage device according to an embodiment of the inventive concept.
Figure 12:
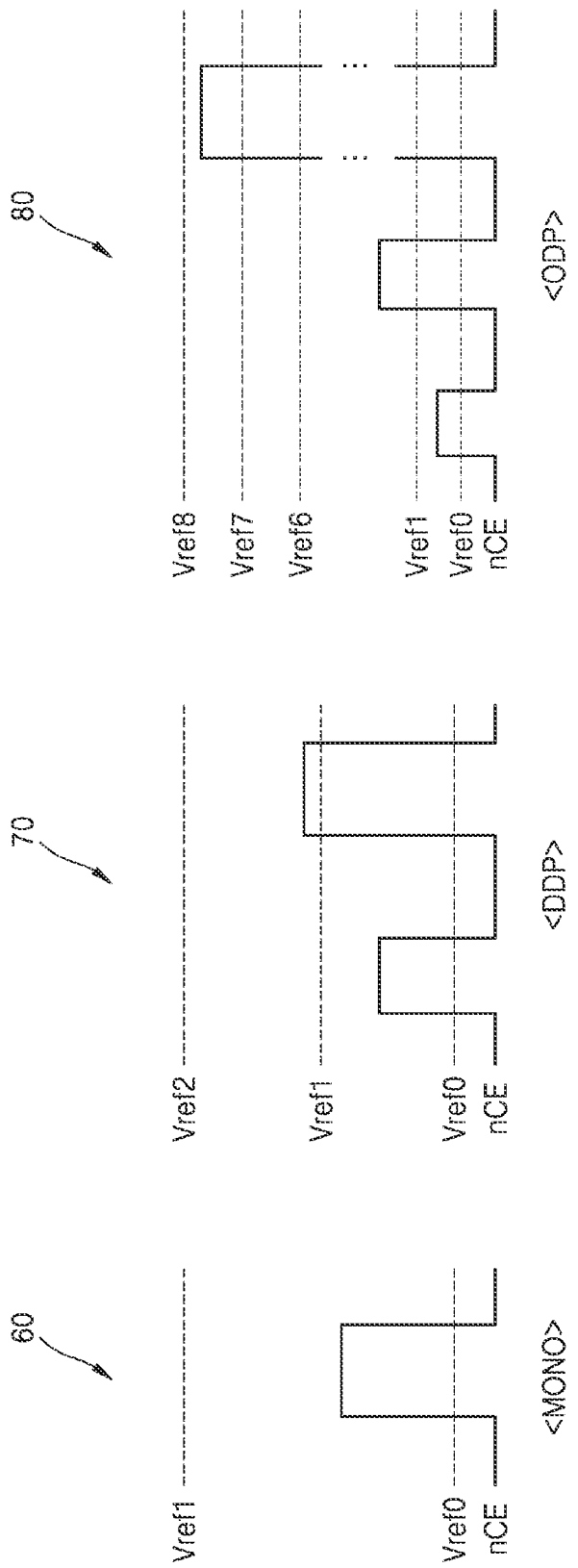
FIG. 12 illustrates a reference voltage period of a plurality of memory chips of FIG. 11 according to an embodiment of the inventive concept.

FIG. 11 is a circuit diagram of the storage device SD1 according to an embodiment of the inventive concept. FIG. 12 illustrates a reference voltage period of the plurality of memory chips CHIP1 to CHIPn of FIG. 11 according to an embodiment of the inventive concept.

Referring to FIGS. 11 and 12, the variable resistor r1 of the storage device SD1 is connected to the ground voltage terminal Vss, and a first voltage terminal is connected to the power voltage terminal Vcc. In an embodiment, the first voltage terminal is connected to a last pin Pn2 of the nth memory chip CHIPn. The controller 50 of FIG. 11 includes a second driver 300a similar to the second driver 300.

A fourth graph 60 of FIG. 12 shows a reference voltage period when the memory device 10 includes one memory chip. The first memory chip CHIP1 may generate the first reference voltage period Vref0 to Vref1 that divides between the voltage level Vref0 of the third pin P3 and the ground voltage level Vref1.

A fifth graph 70 of FIG. 12 shows reference voltage periods when the memory device 10 of FIG. 11 includes two memory chips. The two memory chips CHIP1 and CHIP2 may respectively generate reference voltage periods that divide between the voltage level Vref0 of the third pin P3 and the power voltage level Vref1. For example, the first memory chip CHIP1 may generate the first reference voltage period Vref0 to Vref1, and the second memory chip CHIP2 may generate the second reference voltage period Vref1 to Vref2.

A sixth graph 80 of FIG. 12 shows reference voltage periods when the memory device 10 of FIG. 11 includes eight memory chips. The eight memory chips may respectively generate reference voltage periods that divide between the voltage level Vref0 of the third pin P3 and the power voltage level Vref8. For example, the first memory chip CHIP1 may generate the first reference voltage period Vref0 to Vref1, the second memory chip CHIP2 may generate the second reference voltage period Vref1 to Vref2, and the eighth memory chip may generate the eighth reference voltage period Vref7 to Vref8.

Figures 13, 14:
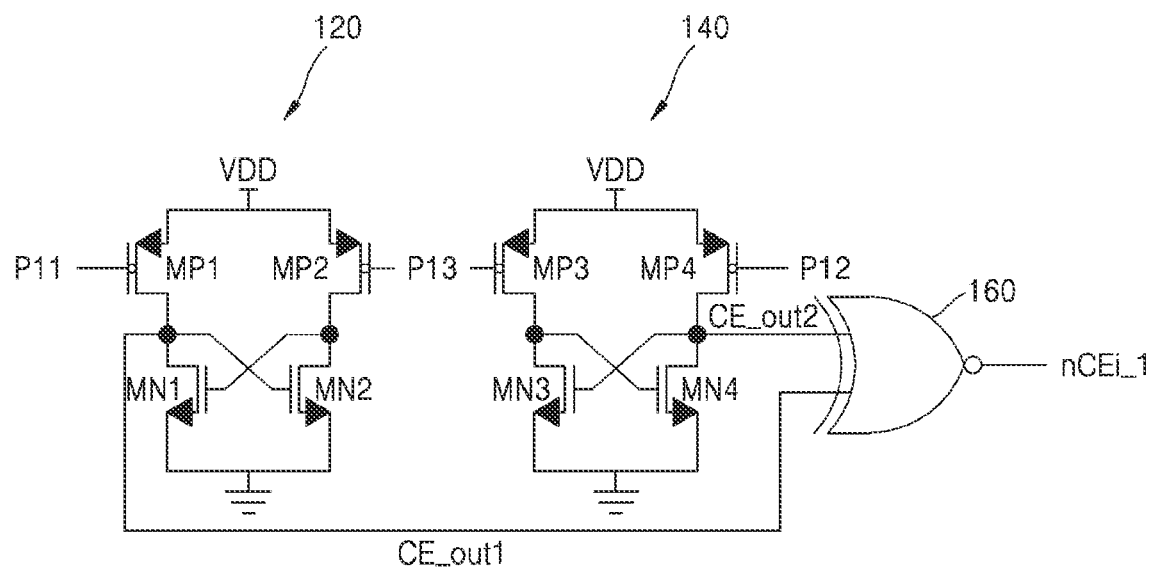
FIG. 13 is a circuit diagram illustrating a first buffer, a second buffer, and an exclusive NOA gate of FIG. 5 according to an embodiment of the inventive concept.
FIG. 14 is a truth table of an exclusive NOR gate of FIG. 13 according to an embodiment of the inventive concept.

FIG. 13 is a circuit diagram illustrating the first buffer 120, the second buffer 140, and the exclusive NOR gate 160 of FIG. 5 according to an embodiment of the inventive concept. FIG. 14 is a truth table of the exclusive NOR gate 160 according to an embodiment of the inventive concept.

Referring to FIG. 5, the first memory chip CHIP1 may include the first buffer 120, the second buffer 140, and the exclusive NOR gate 160. The first buffer 120 may output a first signal CE_out1 from a voltage applied to the first input/output pad P11 and the multi-level chip enable signal nCE received through the third input/output pad P13.

The first buffer 120 may include a first PMOS transistor MP1, a second PMOS transistor MP2, a first NMOS transistor MN1, and a second NMOS transistor MN2. In the first buffer 120, a gate of the first PMOS transistor MP1 may be connected to the first input/output pad P11, a source may be connected to a power voltage terminal VDD, and a drain may be connected to a drain of the first NMOS transistor MN1. A gate of the second PMOS transistor MP2 may be connected to the third input/output pad P13, a source may be connected to the power voltage terminal VDD, and a drain may be connected to a drain of the second NMOS transistor MN2. Sources of the first NMOS transistor MN1 and the second NMOS transistor MN2 may be connected to a ground voltage terminal.

In the first buffer 120, a connection node to which the first PMOS transistor MP1 and the first NMOS transistor MN1 are connected may be connected to a gate of the second NMOS transistor MN2, and a connection node to which the second PMOS transistor MP2 and the second NMOS transistor MN2 are connected may be connected to a gate of the first NMOS transistor MN1. The first signal CE_out1 may be output through the connection node to which the first PMOS transistor MP1 and the first NMOS transistor MN1 are connected.

The second buffer 140 may output a second signal CE_out2 from a voltage of the second input/output pad P12 and the multi-level chip enable signal nCE received through the third input/output pad P13. The second buffer 140 may include a third PMOS transistor MP3, a fourth PMOS transistor MP4, a third NMOS transistor MN3, and a fourth NMOS transistor MN4.

In the second buffer 140, a gate of the third PMOS transistor MP3 may be connected to the third input/output pad P13, a source may be connected to the power voltage terminal VDD, and a drain may be connected to a drain of the third NMOS transistor MN3. A gate of the fourth PMOS transistor MP4 may be connected to the second input/output pad P12, a source may be connected to the power voltage terminal VDD, and a drain may be connected to a drain of the fourth NMOS transistor MN4. Sources of the third NMOS transistor MN3 and the fourth NMOS transistor MN4 may be connected to the ground voltage terminal.

In the second buffer 140, a connection node to which the third PMOS transistor MP3 and the third NMOS transistor MN3 are connected may be connected to a gate of the fourth NMOS transistor MN4, and a connection node to which the fourth PMOS transistor MP4 and the fourth NMOS transistor MN4 are connected may be connected to a gate of the third NMOS transistor MN3. The second signal CE_out2 may be output through the connection node to which the fourth PMOS transistor MP4 and the fourth NMOS transistor MN4 are connected.

The exclusive NOR gate 160 may output an internal chip enable signal nCEi_1 from the first signal CE_out1 and the second signal CE_out2 to an internal circuit. For example, the exclusive NOR gate 160 may perform an exclusive NOR operation on the first signal CE_out1 and the second signal CE_out2. Referring to the truth table of FIG. 14, when the first signal CE_out1 is at a low level and the second signal CE_out2 is at a high level, the internal chip enable signal nCEi_1 may be output at a low level. When the low-level internal chip enable signal nCEi_1 is received through the internal circuit, the first memory chip CHIN may be enabled. The second memory chip CHIP2 may output an internal chip enable signal nCEi_2, and the nth memory chip CHIPn may output an internal chip enable signal nCEi_n.

Figure 15:
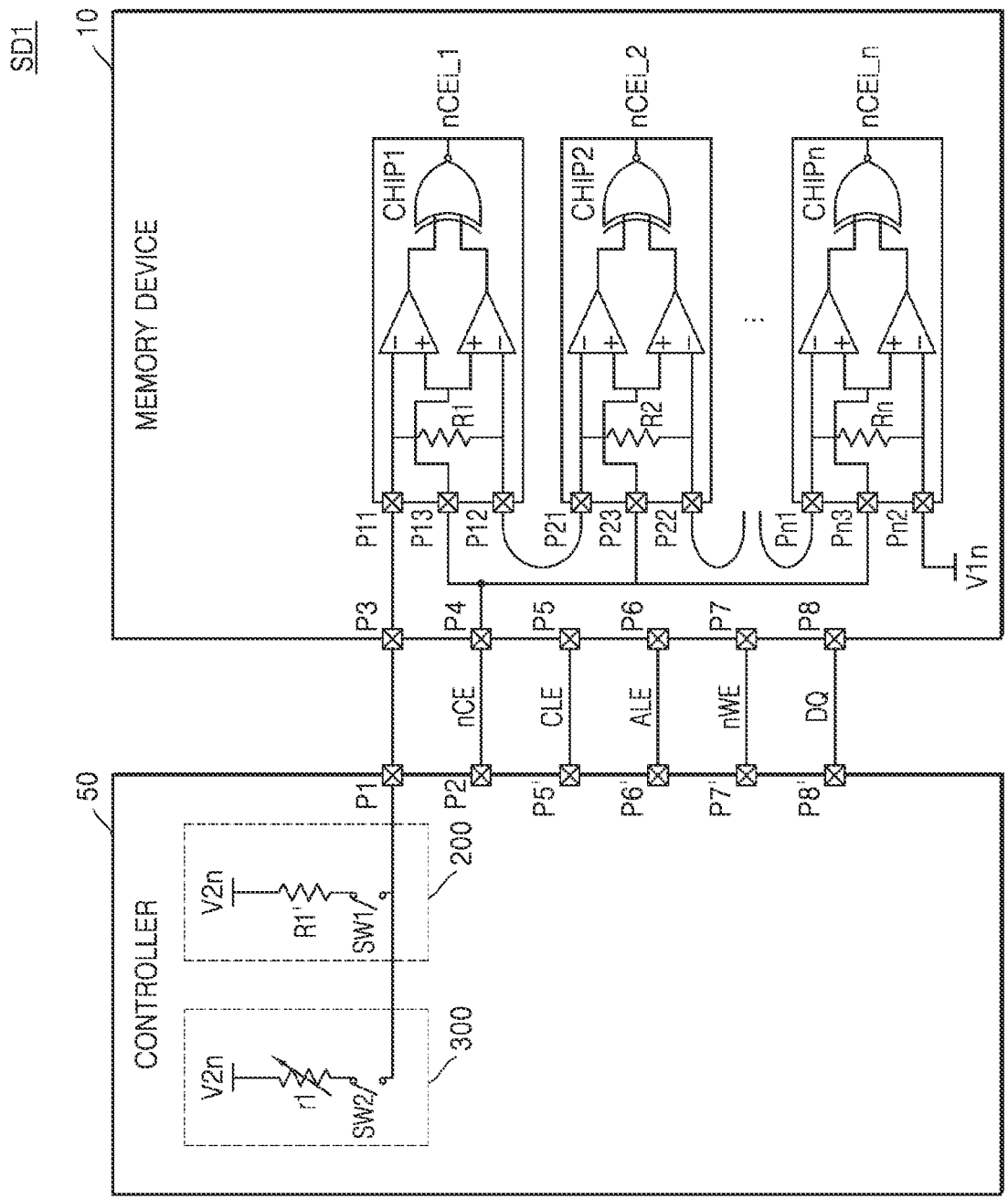
FIG. 15 illustrates an extended storage device according to an embodiment of the inventive concept.

FIG. 15 illustrates the storage device SD1 according to an embodiment of the inventive concept.

Referring to FIGS. 4 and 15, the storage device SD1 of FIG. 4 may be extended to the storage device SD1 of FIG. 15.

The memory device 10 may receive the multi-level chip enable signal nCE, a command latch enable signal CLE, an address latch enable signal ALE, a write enable signal nWE, and a data signal DQ from the memory controller 50 through the fourth to eighth pins P4 to P8. The fourth to eighth pins P4 to P8 may be included in a memory interface circuit. The memory interface circuit may further include pins receiving a read enable signal, a ready/busy output signal, and a data strobe signal.

The memory device 10 may receive the data signal DQ from the controller 50 or transmit the data signal DQ to the controller 50 through the eighth pin P8. The command CMD, the address ADDR, and the data DATA may be transmitted through the data signal DQ. For example, the data signal DQ may be transmitted through a plurality of data signal lines. In this case, the eighth pin P8 may include a plurality of pins corresponding to a plurality of data signals.

The memory device 10 may obtain the command CMD from the data signal DQ received in an enable period (e.g., a high level state) of the command latch enable signal CLE based on toggle timings of the write enable signal nWE. The memory device 10 may obtain the address ADDR from the data signal DQ received in an enable period (e.g., a high level state) of the address latch enable signal ALE based on the toggle timings of the write enable signal nWE.

In some embodiments, the write enable signal nWE may be toggled between a high level and a low level while maintaining a static state (e.g., the high level or the low level). For example, the write enable signal nWE may be toggled in a period in which the command CMD or the address ADDR is transmitted. Accordingly, the memory device 10 may obtain the command CMD or the address ADDR based on the toggle timings of the write enable signal nWE.

Figure 16:
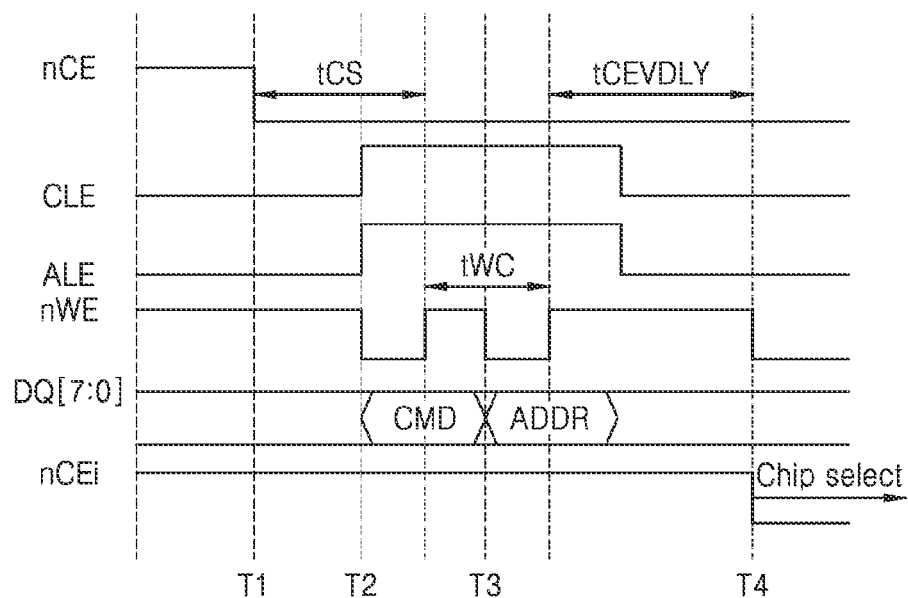
FIG. 16 shows a timing diagram in a chip enable reduction (CER) mode according to a comparative example.

FIG. 16 shows a timing diagram in a CER mode according to a comparative example.

FIG. 16 shows the timing diagram of a memory interface circuit in the CER mode. In some embodiments, the memory interface circuit of FIG. 16 may comply with the Toggle standard specification.

Referring to FIG. 16, at a time point T1, the chip enable signal nCE may be changed from a disable state (e.g., a high level) to an enable state (e.g., a low level). At a time T2, the CER command CMD may be received through the data signal DQ line, and at a time T3, the chip address ADDR may be received through the data signal DQ line. The memory interface circuit may obtain a CER command and a chip address from the data signal DQ received in an enable period (e.g., a high level) of the command latch enable signal CLE and an enable period (e.g., a high level) of the address latch enable signal ALE. At a time T4, a chip in which the obtained chip address ADDR and a hard-bonded address match may be selected.

According to the comparative example, in the CER mode, a time tCS for setting a chip enable, a time tWC for transmitting the CER command CMD and the chip address ADDR, a time tCEVDLY for comparing the chip address ADDR and the hard-bonded address may additionally be required. As a result, there may be a problem in that the efficiency of an input/output interface decreases due to the time required in the CER mode.

Figure 17:
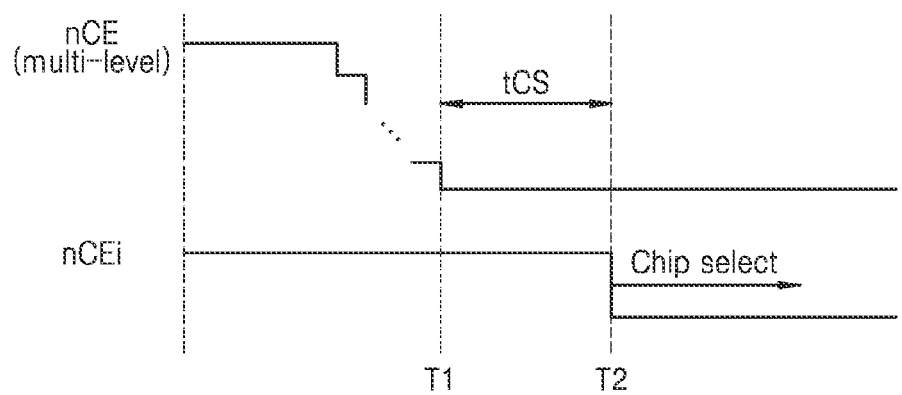
FIG. 17 shows a timing diagram in a CER mode according to an embodiment of the inventive concept.

FIG. 17 shows a timing diagram in a CER mode according to an embodiment of the inventive concept.

FIG. 17 shows the timing diagram in a memory interface circuit receiving the multi-level chip enable signal nCE. In some embodiments, the memory interface circuit of FIG. 17 may comply with the Toggle standard specification.

Referring to FIG. 17, the memory interface circuit may receive the multi-level chip enable signal nCE. At a time T1, a voltage level of the multi-level chip enable signal nCE may correspond to a first reference voltage period that is one of a plurality of reference voltage periods. The internal chip enable signal nCEi may be changed from a disable state (e.g., high level) to an enable state (e.g., low level) at a time T2 after the time tCS for setting the chip enable from the time T1 has passed. In addition, a memory chip corresponding to the first reference voltage period may be selected.

According to an embodiment of the inventive concept, when the multi-level chip enable signal nCE corresponds to the first reference voltage period that is one of the plurality of reference voltage periods, the memory chip corresponding to the first reference voltage period may be selected, and thus a time (e.g., tWC in FIG. 16) for transmitting a CER command and a chip address and a time (e.g., tCEVDLY in FIG. 16) for comparing the chip address and a hard-bonded address may be omitted, and accordingly, efficiency of an input/output interface may be improved.

Figure 18:
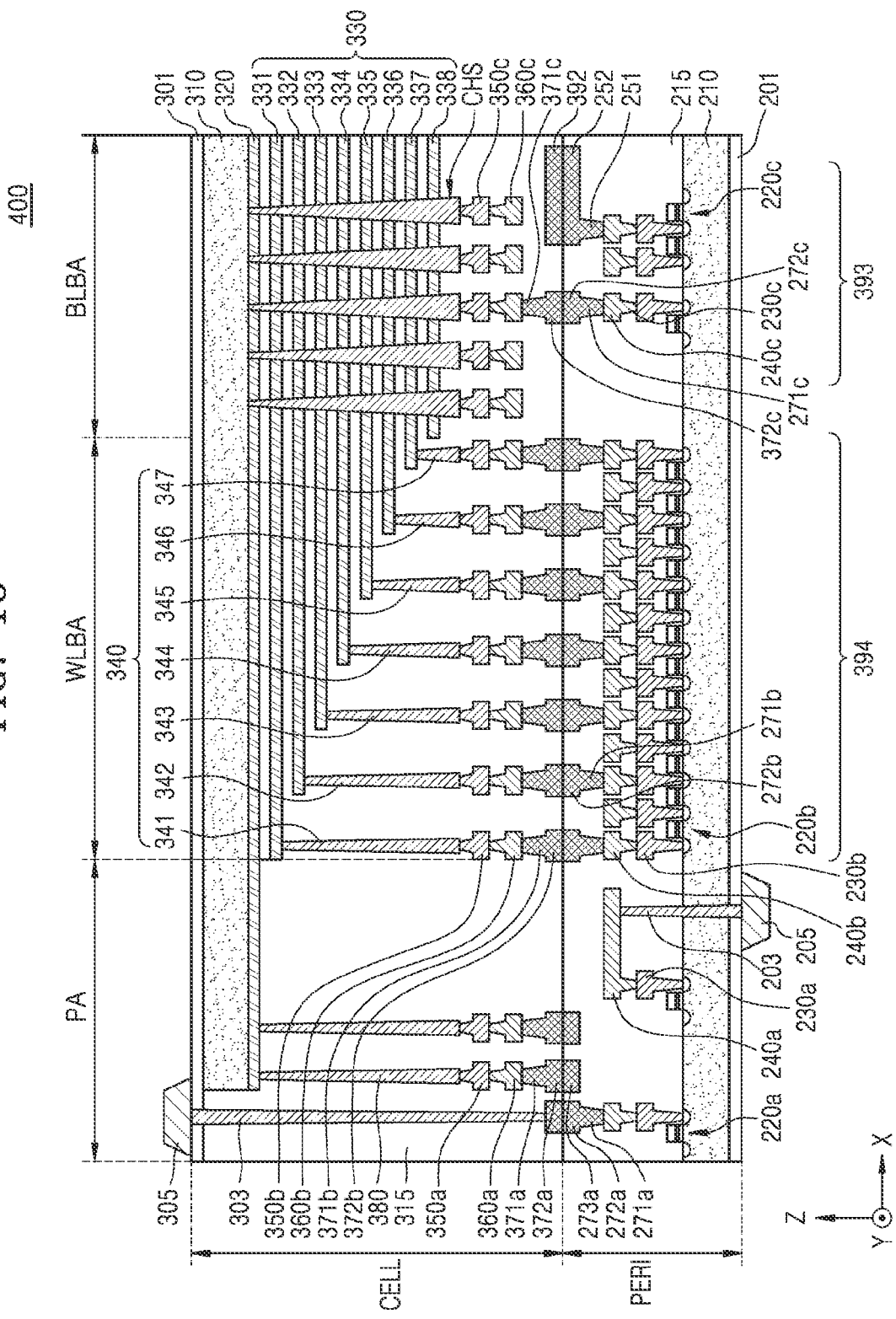
FIG. 18 shows a memory device according to an embodiment of the inventive concept.

FIG. 18 is a diagram illustrating a memory device 400 according to an example embodiment.

Referring to FIG. 18, a memory device 400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, is not limited thereto. For example, the bonding metals may also be formed of aluminum (Al) or tungsten (W).

Each of the peripheral circuit region PERI and the cell region CELL of the memory device 400 may include an external pad bonding area PA, a word line bonding area WLBA, and a bit line bonding area BLBA.

The peripheral circuit region PERI may include a first substrate 210, an interlayer insulating layer 215, a plurality of circuit elements 220a, 220b, and 220c formed on the first substrate 210, first metal layers 230a, 230b, and 230c respectively connected to the plurality of circuit elements 220a, 220b, and 220c, and second metal layers 240a, 240b, and 240c formed on the first metal layers 230a, 230b, and 230c. In an example embodiment, the first metal layers 230a, 230b, and 230c may be formed of tungsten having relatively high electrical resistivity, and the second metal layers 240a, 240b, and 240c may be formed of copper having relatively low electrical resistivity.

In an example embodiment illustrate in FIG. 18, although only the first metal layers 230a, 230b, and 230c and the second metal layers 240a, 240b, and 240c are shown and described, the example embodiment is not limited thereto, and one or more additional metal layers may be further formed on the second metal layers 240a, 240b, and 240c. At least a portion of the one or more additional metal layers formed on the second metal layers 240a, 240b, and 240c may be formed of aluminum or the like having a lower electrical resistivity than those of copper forming the second metal layers 240a, 240b, and 240c.

The interlayer insulating layer 215 may be disposed on the first substrate 210 and cover the plurality of circuit elements 220a, 220b, and 220c, the first metal layers 230a, 230b, and 230c, and the second metal layers 240a, 240b, and 240c. The interlayer insulating layer 215 may include an insulating material such as silicon oxide, silicon nitride, or the like.

Lower bonding metals 271b and 272b may be formed on the second metal layer 240b in the word line bonding area WLBA. In the word line bonding area WLBA, the lower bonding metals 271b and 272b in the peripheral circuit region PERI may be electrically bonded to upper bonding metals 371b and 372b of the cell region CELL. The lower bonding metals 271b and 272b and the upper bonding metals 371b and 372b may be formed of aluminum, copper, tungsten, or the like. Further, the upper bonding metals 371b and 372b in the cell region CELL may be referred as first metal pads and the lower bonding metals 271b and 272b in the peripheral circuit region PERI may be referred as second metal pads.

The cell region CELL may include at least one memory block. The cell region CELL may include a second substrate 310 and a common source line 320. On the second substrate 310, a plurality of word lines 331 to 338 (i.e., 330) may be stacked in a direction (a Z-axis direction), perpendicular to an upper surface of the second substrate 310. At least one string select line and at least one ground select line may be arranged on and below the plurality of word lines 330, respectively, and the plurality of word lines 330 may be disposed between the at least one string select line and the at least one ground select line.

In the bit line bonding area BLBA, a channel structure CH may extend in a direction (a Z-axis direction), perpendicular to the upper surface of the second substrate 310, and pass through the plurality of word lines 330, the at least one string select line, and the at least one ground select line. The channel structure CH may include a data storage layer, a channel layer, a buried insulating layer, and the like, and the channel layer may be electrically connected to a first metal layer 350c and a second metal layer 360c. For example, the first metal layer 350c may be a bit line contact, and the second metal layer 360c may be a bit line. In an example embodiment, the bit line 360c may extend in a first direction (a Y-axis direction), parallel to the upper surface of the second substrate 310.

In an example embodiment illustrated in FIG. 18, an area in which the channel structure CH and the bit line 360c are disposed may be defined as the bit line bonding area BLBA. In the bit line bonding area BLBA, the bit line 360c may be electrically connected to the circuit elements 220c providing a page buffer 393 in the peripheral circuit region PERI. The bit line 360c may be connected to upper bonding metals 371c and 372c in the cell region CELL, and the upper bonding metals 371c and 372c may be connected to lower bonding metals 271c and 272c connected to the circuit elements 220c of the page buffer 393. In an example embodiment, a program operation may be executed based on a page unit as write data of the page-unit is stored in the page buffer 393, and a read operation may be executed based on a sub-page unit as read data of the sub-page unit is stored in the page buffer 393. Also, in the program operation and the read operation, units of data transmitted through bit lines may be different from each other.

In the word line bonding area WLBA, the plurality of word lines 330 may extend in a second direction (an X-axis direction), parallel to the upper surface of the second substrate 310 and perpendicular to the first direction, and may be connected to a plurality of cell contact plugs 341 to 347 (i.e., 340). The plurality of word lines 330 and the plurality of cell contact plugs 340 may be connected to each other in pads provided by at least a portion of the plurality of word lines 330 extending in different lengths in the second direction. A first metal layer 350b and a second metal layer 360b may be connected to an upper portion of the plurality of cell contact plugs 340 connected to the plurality of word lines 330, sequentially. The plurality of cell contact plugs 340 may be connected to the peripheral circuit region PERI by the upper bonding metals 371b and 372b of the cell region CELL and the lower bonding metals 271b and 272b of the peripheral circuit region PERI in the word line bonding area WLBA.

The plurality of cell contact plugs 340 may be electrically connected to the circuit elements 220b forming a row decoder 394 in the peripheral circuit region PERI. In an example embodiment, operating voltages of the circuit elements 220b of the row decoder 394 may be different than operating voltages of the circuit elements 220c forming the page buffer 393. For example, operating voltages of the circuit elements 220c forming the page buffer 393 may be greater than operating voltages of the circuit elements 220b forming the row decoder 394.

A common source line contact plug 380 may be disposed in the external pad bonding area PA. The common source line contact plug 380 may be formed of a conductive material such as a metal, a metal compound, polysilicon, or the like, and may be electrically connected to the common source line 320. A first metal layer 350a and a second metal layer 360a may be stacked on an upper portion of the common source line contact plug 380, sequentially. For example, an area in which the common source line contact plug 380, the first metal layer 350a, and the second metal layer 360a are disposed may be defined as the external pad bonding area PA.

Input-output pads 205 and 305 may be disposed in the external pad bonding area PA. Referring to FIG. 18, a lower insulating film 201 covering a lower surface of the first substrate 210 may be formed below the first substrate 210, and a first input-output pad 205 may be formed on the lower insulating film 201. The first input-output pad 205 may be connected to at least one of the plurality of circuit elements 220a, 220b, and 220c disposed in the peripheral circuit region PERI through a first input-output contact plug 203, and may be separated from the first substrate 210 by the lower insulating film 201. In addition, a side insulating film may be disposed between the first input-output contact plug 203 and the first substrate 210 to electrically separate the first input-output contact plug 203 and the first substrate 210.

Referring to FIG. 18, an upper insulating film 301 covering the upper surface of the second substrate 310 may be formed on the second substrate 310, and a second input-output pad 305 may be disposed on the upper insulating layer 301. The second input-output pad 305 may be connected to at least one of the plurality of circuit elements 220a, 220b, and 220c disposed in the peripheral circuit region PERI through a second input-output contact plug 303. In the example embodiment, the second input-output pad 305 is electrically connected to a circuit element 220a.

According to an embodiment, the second substrate 310 and the common source line 320 are not disposed in an area in which the second input-output contact plug 303 is disposed. Also, the second input-output pad 305 does not overlap the word lines 330 in the third direction (the Z-axis direction). Referring to FIG. 18, the second input-output contact plug 303 may be separated from the second substrate 310 in a direction, parallel to the upper surface of the second substrate 310, and may pass through the interlayer insulating layer 315 of the cell region CELL to be connected to the second input-output pad 305.

According to an embodiment, the first input-output pad 205 and the second input-output pad 305 are selectively formed. For example, the memory device 400 may include only the first input-output pad 205 disposed on the first substrate 210 or the second input-output pad 305 disposed on the second substrate 310. Alternatively, the memory device 400 may include both the first input-output pad 205 and the second input-output pad 305.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 400 may include a lower metal pattern 273a, corresponding to an upper metal pattern 372a formed in an uppermost metal layer of the cell region CELL, and having the same cross-sectional shape as the upper metal pattern 372a of the cell region CELL so as to be connected to each other, in an uppermost metal layer of the peripheral circuit region PERI. In the peripheral circuit region PERI, the lower metal pattern 273a formed in the uppermost metal layer of the peripheral circuit region PERI may not be connected to a contact. Similarly, in the external pad bonding area PA, an upper metal pattern 372a, corresponding to the lower metal pattern 273a formed in an uppermost metal layer of the peripheral circuit region PERI, and having the same shape as a lower metal pattern 273a of the peripheral circuit region PERI, may be formed in an uppermost metal layer of the cell region CELL.

The lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to the upper bonding metals 371b and 372b of the cell region CELL by a Cu-to-Cu bonding.

Further, in the bit line bonding area BLBA, an upper metal pattern 392, corresponding to a lower metal pattern 252 formed in the uppermost metal layer of the peripheral circuit region PERI, and having the same cross-sectional shape as the lower metal pattern 252 of the peripheral circuit region PERI, may be formed in an uppermost metal layer of the cell region CELL. A contact may not be formed on the upper metal pattern 392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

The memory device according to the embodiments described above with reference to FIGS. 1 to 17 may be implemented as a multi-chip package. For example, the memory device 10 illustrated in FIG. 4 may include a package substrate and the plurality of memory chips CHIP1 to CHIPn mounted on the package substrate.

Each of the plurality of memory chips CHIP1 to CHIPn may be implemented in a C2C structure like that illustrated in FIG. 18. For example, the first memory chip CHIP1 which is one of the plurality of memory chips CHIP1 to CHIPn of FIG. 4 may include a memory cell area CELL including the first metal pad 871b or 872b, and the peripheral circuit area PERI including a second metal pad 771b or 772b and vertically connected to the memory cell area CELL by the first metal pad 871b or 872b and the second metal pad 771b or 772b. The peripheral circuit area PERI of the first memory chip CHIP1 may include the first input/output pad P11, the second input/output pad P12, and the resistor R1 connected between the first input/output pad P11 and the second input/output pad P12. For example, the first input/output pad P11 and the second input/output P12 may be implemented as the input/output pads 205 and 305 disposed in the external pad bonding area PA, and the resistor R1 may be implemented as the plurality of circuit elements 220a, 220b, and 220c on the substrate 201 disposed in the circuit area PERI. In addition, the resistor R1 may be connected between the first input/output pad P11 and the second input/output pad P12 through at least one of the input/output contact plugs 203 and 303.

While the inventive concept has been particularly shown and described with reference to embodiments thereof, it will be understood that various changes in form and details may be made therein without departing from the spirit and scope of the following claims.

What is claimed is:

1. A storage device comprising:
   a controller comprising first and second pins, and configured to output a multi-level chip enable signal through the second pin; and
   a memory device comprising a third pin connected to the first pin and a fourth pin connected to the second pin, and a plurality of memory chips commonly connected to the fourth pin, the plurality of memory chips respectively comprising a plurality of resistors connected to each other in a daisy-chain structure between the third pin and a first voltage terminal,
   wherein the plurality of memory chips are configured to respectively generate a plurality of reference voltage periods that divide between a voltage level of the third pin and a voltage level of the first voltage terminal based on the plurality of resistors, and
   wherein when a voltage level of the multi-level chip enable signal corresponds to one of the plurality of reference voltage periods, a memory chip corresponding to the one reference voltage period is selected from among the plurality of memory chips.

2. The storage device of claim 1, wherein the controller further comprises a first resistor connected to the first pin, and is configured to detect a number of the plurality of memory chips based on a voltage level of the first pin.

3. The storage device of claim 2, wherein the controller further comprise a variable resistor connected to the first pin, and a value of the variable resistor varies based on the detected number of the plurality of memory chips.

4. The storage device of claim 3, wherein the first resistor and the variable resistor are each connected to a power voltage terminal, and the first voltage terminal is connected to a ground voltage terminal.

5. The storage device of claim 3, wherein the first resistor and the variable resistor are each connected to a ground voltage terminal, and the first voltage terminal is connected to a power voltage terminal.

6. The storage device of claim 1, wherein each of the plurality of memory chips comprises:
a first input/output pad;
a second input/output pad; and
the resistors are connected between the first input/output pad and the second input/output pad.

7. The storage device of claim 6, wherein an output of the second input/output pad of a first one of the memory chips is configured to be input to the first input/output pad of a second one of the memory chips.

8. The storage device of claim 7, wherein each of the plurality of memory chips comprises:
a first buffer configured to output a first signal from a voltage of the first input/output pad and the multi-level chip enable signal; and
a second buffer configured to output a second signal from a voltage of the second input/output pad and the multi-level chip enable signal.

9. The storage device of claim 8, wherein each of the plurality of memory chips further comprises:
an exclusive NOR gate configured to output an internal chip enable signal from the first signal and the second signal.

10. The storage device of claim 1, wherein the memory device comprises:
a package substrate on which the third and fourth pins are disposed; and
the plurality of memory chips mounted on the package substrate,
wherein each of the plurality of memory chips further comprises:
a memory cell region comprising a first metal pad; and
a peripheral circuit region comprising a second metal pad, and vertically connected to the memory cell region by the first metal pad and the second metal pad.

11. A storage device comprising:
a plurality of memory chips respectively comprising a plurality of resistors; and
a controller connected to the plurality of memory chips through a first pin and comprising a first resistor connected to the first pin,
wherein the plurality of resistors included in the plurality of memory chips are connected in a daisy-chain structure to one another between a third pin connected to the first pin and a first voltage terminal, and
wherein the controller is configured to detect package information indicating a number of the plurality of memory chips based on a voltage level of the first pin.

12. The storage device of claim 11, wherein each of the plurality of memory chips comprises:
a first input/output pad;
a second input/output pad; and
the resistors are connected between the first input/output pad and the second input/output pad.

13. The storage device of claim 12, wherein an output of the second input/output pad of a first one of the memory chips is configured to be input to the first input/output pad of a second one of the memory chips.

14. The storage device of claim 11, wherein the controller is configured to detect the number of the plurality of memory chips by comparing the voltage level of the first pin with a plurality of reference values set according to the number of the plurality of memory chips.

15. The storage device of claim 11, wherein the first resistor is connected to a power voltage terminal, and the first voltage terminal is connected to a ground voltage terminal.

16. The storage device of claim 11, wherein the first resistor is connected to a ground voltage terminal, and the first voltage terminal is connected to a power voltage terminal.

17. An operating method of a storage device, the operating method comprising:
a plurality of memory chips respectively generating a plurality of reference voltage periods that divide between a first voltage level and a voltage level of a first voltage terminal connected to a plurality of resistors based on the plurality of resistors connected to one another in a daisy-chain structure; and
a controller outputting a multi-level chip enable signal to the plurality of memory chips,
wherein when a voltage level of the multi-level chip enable signal corresponds to one of the plurality of reference voltage periods, a memory chip corresponding to the one reference voltage period is selected from among the plurality of memory chips.

18. The operating method of claim 17, further comprising:
the controller setting a variable resistance value of a resistor of the controller such that the first voltage level is independent from a number of the plurality of memory chips, wherein the resistor is connected to an input/output pad of a first one of the memory chips.

19. The operating method of claim 18, further comprising:
the controller detecting the number of the plurality of memory chips by detecting a voltage distributed between a first resistor connected to the plurality of resistors connected in the daisy-chain structure to one another and the plurality of resistors in response to a power voltage.

20. The operating method of claim 17, wherein the generating of the plurality of reference voltage periods comprises:
generating a plurality of reference voltage periods equally dividing between the first voltage level and a voltage level of the first voltage terminal based on a same resistance value of each of the plurality of resistors connected in the daisy-chain structure.

* * * * *